(12) United States Patent
Schneider et al.

(10) Patent No.: US 6,379,487 B1
(45) Date of Patent: Apr. 30, 2002

(54) COMPONENT OF PRINTED CIRCUIT BOARD

(75) Inventors: Bernd Schneider, March-Holzhausen (DE); R. Richard Steiner, University Heights, OH (US)

(73) Assignee: GA-TEK Inc., Eastlake, OH (US)

( * ) Notice: Subject to any disclaimer, the term of this patent is extended or adjusted under 35 U.S.C. 154(b) by 0 days.

(21) Appl. No.: 09/566,289

(22) Filed: May 5, 2000

(51) Int. Cl.[7] .......................... B44C 1/14; B32B 31/20; B32B 15/18; B41M 3/12; C25D 7/06
(52) U.S. Cl. ................. 156/230; 156/233; 156/247; 156/289; 156/540; 427/146; 427/148; 427/96; 427/123; 427/209; 427/405; 428/914; 428/638; 428/674; 205/152; 205/239
(58) Field of Search ................. 156/230, 233, 156/235, 240, 241, 247, 289, 540, 150, 151, 330; 427/146, 147, 148, 96, 123, 124, 209, 404, 405, 435, 436; 428/343, 344, 345, 615, 606, 620, 638, 674, 924; 205/102, 152, 243, 239, 283, 291, 915

(56) References Cited

U.S. PATENT DOCUMENTS

| | | | |
|---|---|---|---|
| 3,532,587 A | 10/1970 | Ungar et al. | 161/120 |
| 3,990,926 A | * 11/1976 | Konicek | 156/3 |
| 4,073,699 A | 2/1978 | Hutkin | 204/13 |
| 4,088,544 A | 5/1978 | Hutkin | 204/12 |
| 4,568,413 A | * 2/1986 | Toth et al. | 156/151 |
| 4,715,116 A | 12/1987 | Thorpe et al. | 29/846 |
| 4,770,947 A | 9/1988 | Flagello et al. | 428/630 |
| 4,781,991 A | 11/1988 | Thorpe et al. | 428/626 |
| 5,126,016 A | 6/1992 | Glenning et al. | 205/125 |
| 5,246,565 A | 9/1993 | Mignardot | 205/181 |
| 5,427,848 A | 6/1995 | Baer et al. | 428/332 |
| 5,447,619 A | 9/1995 | Wolski et al. | 205/50 |
| 5,491,036 A | 2/1996 | Carey, II et al. | 428/647 |
| 5,552,234 A | 9/1996 | Kawasumi | 428/633 |
| 5,617,629 A | * 4/1997 | Ekström | 29/846 |
| 6,130,000 A | * 10/2000 | Frater | 428/687 |

\* cited by examiner

*Primary Examiner*—Richard Crispino
*Assistant Examiner*—J. A. Lorengo
(74) *Attorney, Agent, or Firm*—Mark Kusner; Michael A. Jaffe; Michael A. Centanni

(57) ABSTRACT

A method of forming a laminate used in the manufacture of printed circuit boards, comprising the steps of applying a layer of chromium having a thickness from about 30 grams per square meter to about 160 grams per square meter to each side of a steel substrate having a thickness from about 0.10 mm to about 0.20 mm. Applying a layer of copper having a thickness from about 2 $\mu$m to about 70 $\mu$m to each of the chromium layers. Positioning the steel substrate between two dielectric layers with adhesive disposed between the copper layers and the dielectric layers. Applying heat and pressure to the layers to bond the copper layers to the dielectric layers. Separating the steel substrate from the copper layers, and discarding the steel substrate.

7 Claims, 5 Drawing Sheets

COMPONENT OF PRINTED CIRCUIT BOARD

FIELD OF THE INVENTION

The present invention relates generally to printed circuit boards, and more particularly, to a method for forming components used in the manufacturing of printed circuit boards and other articles.

BACKGROUND OF THE INVENTION

In the manufacture of printed circuit boards, sheets of copper foil are typically bonded to a dielectric layer of a partially cured epoxy resin containing woven glass fiber (such a dielectric layer is conventionally referred to as a "prepreg"). In the manufacture of copper clad laminates, sheets of copper foil are typically bonded to another layer of foil. In both processes, the copper foil is etched to produce conductive paths. In recent years, the trend has been to reduce the size of electronic components, and to increase the number of such components provided on a printed circuit board. A key to providing a densely populated circuit board is to produce close and fine circuit patterns from the copper. This in turn has resulted in a drive to provide laminates having thinner and thinner layers of copper thereon.

A problem with copper foils is that at a certain thickness (about 0.5 oz. per square foot), the copper foil becomes very difficult to handle. It has been known to apply copper onto temporary carrier sheets such as plastic and metal for later transfer to dielectric layers or another copper layer. Depositing their copper on these carrier layers adds another step in the manufacturing process preceding the attachment of the copper to a dielectric substrate.

The present invention provides a method of forming components used in the manufacture of printed circuit boards, which components have thin layers of copper thereon.

SUMMARY OF THE INVENTION

In accordance with a preferred embodiment of the present invention, there is a method of forming a laminate used in the manufacture of printed circuit boards. The method comprises the steps of:

applying a layer of chromium having a thickness from about 30 grams per square meter to about 160 grams per square meter to each side of a steel substrate having a thickness from about 0.10 mm to about 0.20 mm;

applying a layer of copper having a thickness from about 2 $\mu$m to about 70 $\mu$m to each of said chromium layers;

positioning said steel substrate between two dielectric layers with adhesive disposed between said copper layers and said dielectric layers;

applying heat and pressure to said layers to bond said copper layers to said dielectric layers;

separating said steel substrate from said copper layers; and discarding said steel substrate.

It is an object of the present invention to provide a component having a copper layer for use in manufacturing articles such as printed circuit boards.

It is a further object of the present invention to provide a component as described above wherein the metallic substrate is a relatively low-cost, discardable item.

It is a further object of the present invention to provide a component as described above wherein the metallic substrate is formed of carbon steel and has an outer layer of an inert metal thereon for engagement with a copper sheet.

It is a further object of the present invention to provide a component as described above wherein the inert metal is chromium.

It is another object of the present invention to provide a component as described above that is suitable for high-temperature processing applications.

A still further object of the present invention to provide a component as described above wherein the discardable metallic substrate has a co-efficient of thermal expansion approximately equal to the co-efficient of thermal expansion of pressed plates used in forming laminated printed circuits.

A still further object of the present invention is to provide a component as described above wherein the metallic substrate is dimensioned for use as a press plate in a circuit board forming operation.

A still further object of the present invention is to provide a method of forming the above-identified component that is used in manufacturing articles such as printed circuit boards.

These and other objects will become apparent from the following description of a preferred embodiment taken together with the accompanying drawings.

BRIEF DESCRIPTION OF THE DRAWINGS

The invention may take physical form in certain parts and arrangement of parts, a preferred embodiment of which will be described in detail in the specification and illustrated in the accompanying drawings which form a part hereof, and wherein.

DETAILED DESCRIPTION OF PREFERRED EMBODIMENT

Figure 1:
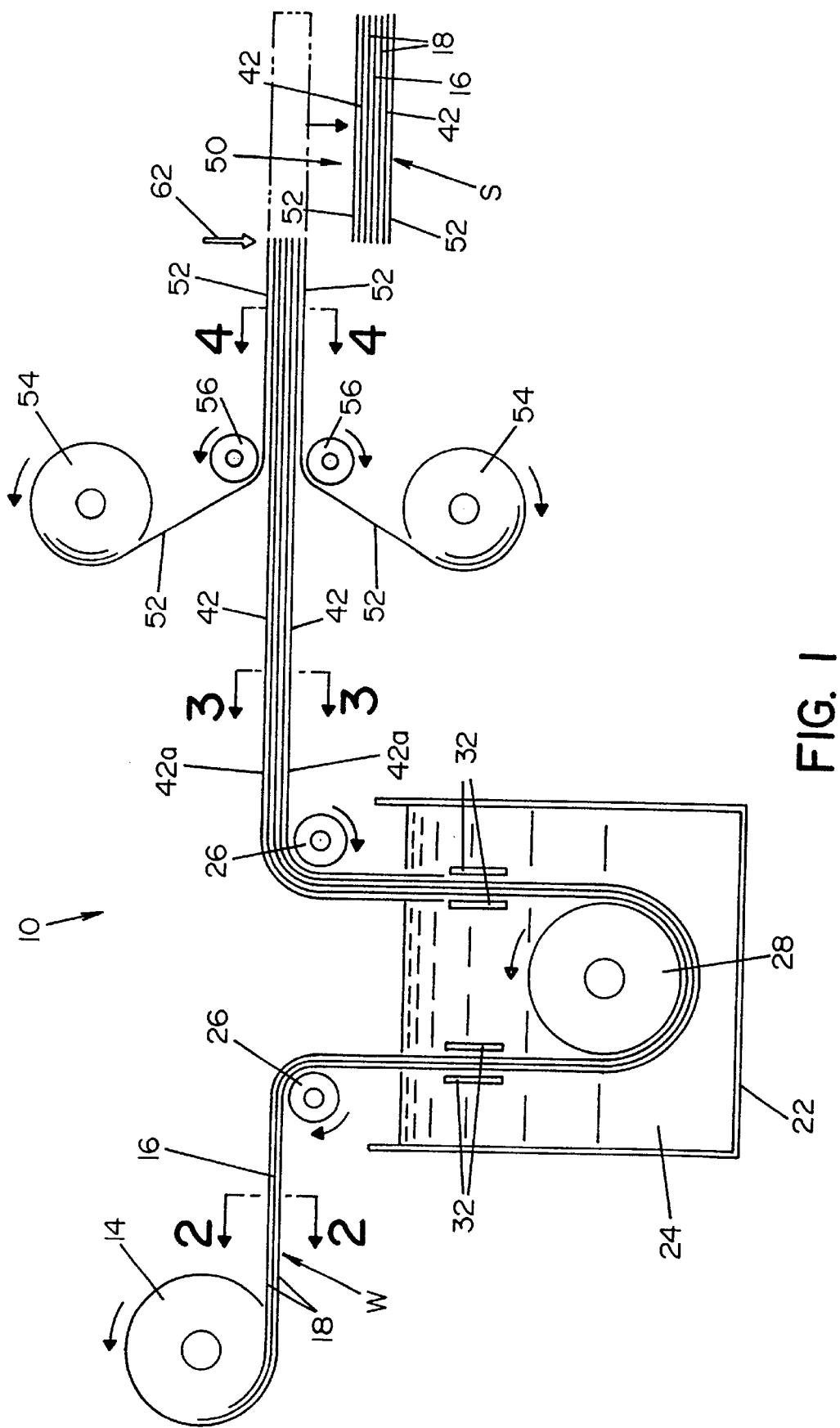
FIG. 1 is a schematic view of a process for forming a component that is used in manufacturing printed circuit boards or copper clad laminates.

Referring now to the drawings wherein the showings are for the purpose of illustrating the preferred embodiment of the invention only, and not for the purpose of limiting same, FIG. 1 is a schematic view of a process 10 for forming a component 50 that is used in manufacturing printed circuit boards or copper clad laminates. A generally continuous strip of carrier material W is fed from a roll 14. Web W is basically comprised of a carbon steel substrate 16 having layers 18 of chromium on both surfaces thereof. In accordance with the present invention, substrate 16 has a thickness from about 0.10 mm to about 0.20 mm, and more preferably from about 0.14 mm to about 0.18 mm. Chromium layer 18 has a thickness from about 30 grams per square meter to about 160 grams per square meter, and more preferably from about 50 grams per square meter to about 140 grams per square meter. Chromium layer 18 is preferably applied to substrate 16 by a vacuum metalization process or by an electrodeposition process (not shown). The thickness of substrate 16 and chromium layers 18 are important as they relate to the process that shall be hereinafter described in greater detail. Carrier material W (comprised of steel substrate 16 and chromium layers 18) undergoes an electrodeposition process wherein copper is deposited onto the exposed surfaces of chromium layers 18. In the embodiment shown, web W is conveyed through a tank 22 containing an electrolytic solution 24. Web W is guided into tank 22 by cathodic guide rollers 26 around a drum 28 within tank 22. Web W passes between pairs of side-by-side anodes 32 that are operative to plate copper from electrolytic solution 24 onto moving web W. Copper layers 42 preferably have a thickness from about 2 µm to about 70 µm. In one embodiment, copper layers 42 have a thickness from about 3 µm to about 35 µm. In another embodiment, copper layers 42 have a thickness from about 5 µm to about 9 µm. In yet another embodiment, copper layers 42 have a thickness of about 9 µm.

Figure 2:
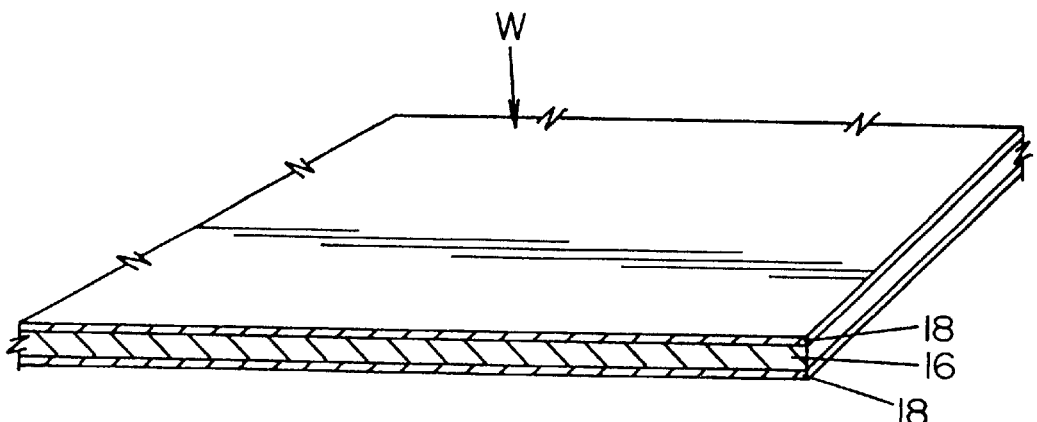
FIG. 2 is a sectional view taken along lines 2—2 of FIG. 1.
Figure 3:
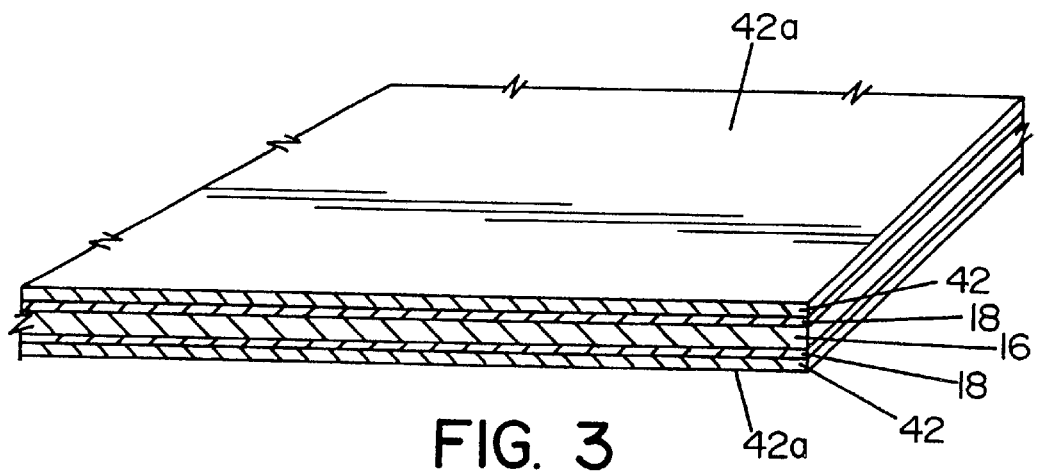
FIG. 3 is a sectional view taken along lines 3—3 of FIG. 1.
Figure 4:
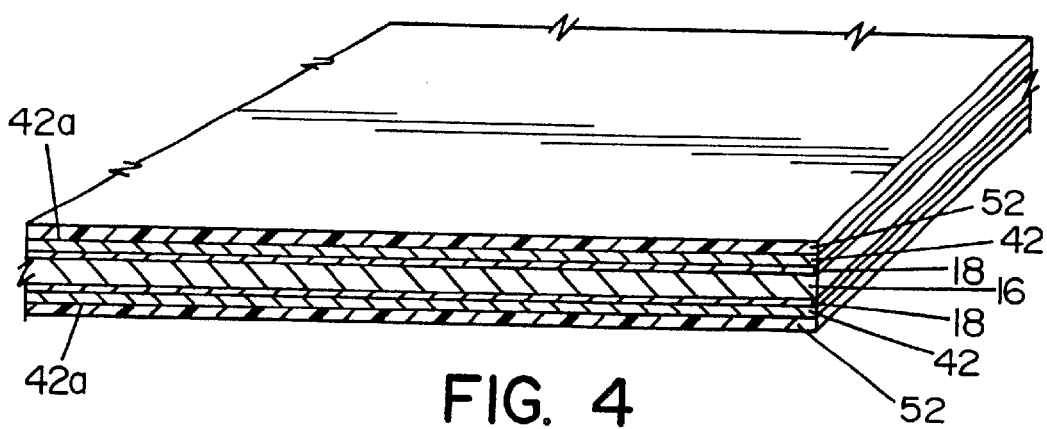
FIG. 4 is a sectional view taken along lines 4—4 of FIG. 1.

FIG. 2 is a cross-sectional view of web W comprised of steel substrate 16, chromium layers 18 and copper layers 42. Copper layers 42 have exposed outer surfaces designated 42a. Surfaces 42a of copper layers 42 are covered with a polymeric release layer 52, as best seen in FIG. 4. Release layers 52 are provided from feed rolls 54 and are forced onto surfaces 42a of copper layers 42 by pinch rollers 56. The resulting component is shown in cross-section in FIG. 4. Web W is conveyed to a cutting device 62, schematically illustrated in FIG. 1, that severs web W into individual sheets, designated S sheets, that are stacked and conveyed to a laminator for assembly as part of a printed circuit board or copper clad laminate.

Figure 5A:
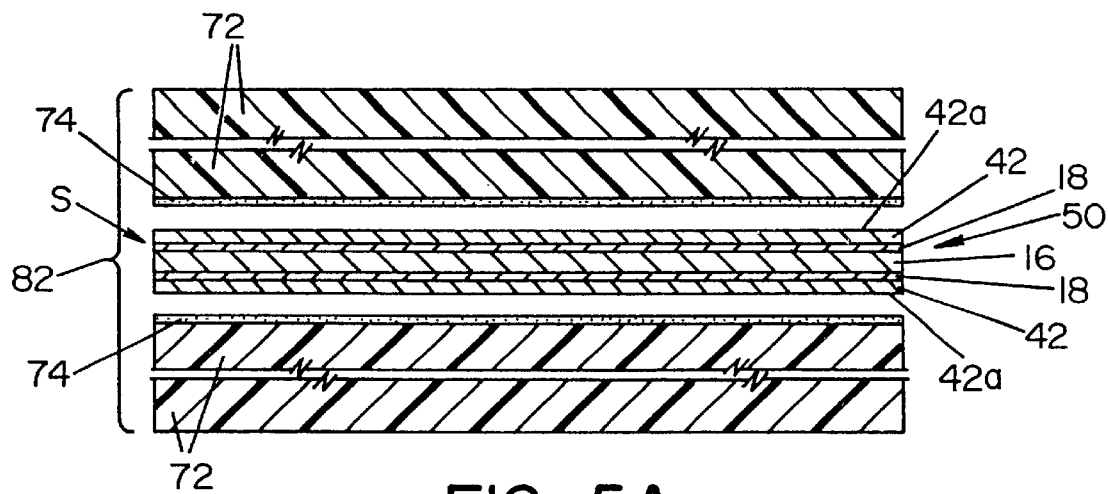
FIG. 5A is a cross-sectional view showing a stack comprised of a component formed in accordance with the present invention between two adhesive coated prepreg layers.
Figure 5B:
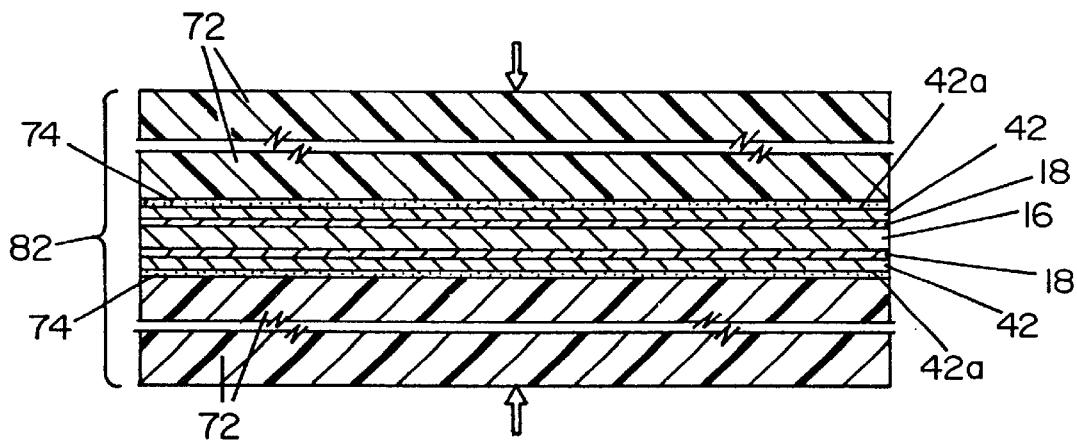
FIG. 5B is a cross-sectional view showing the stack shown in FIG. 5A compressed together.
Figure 5C:
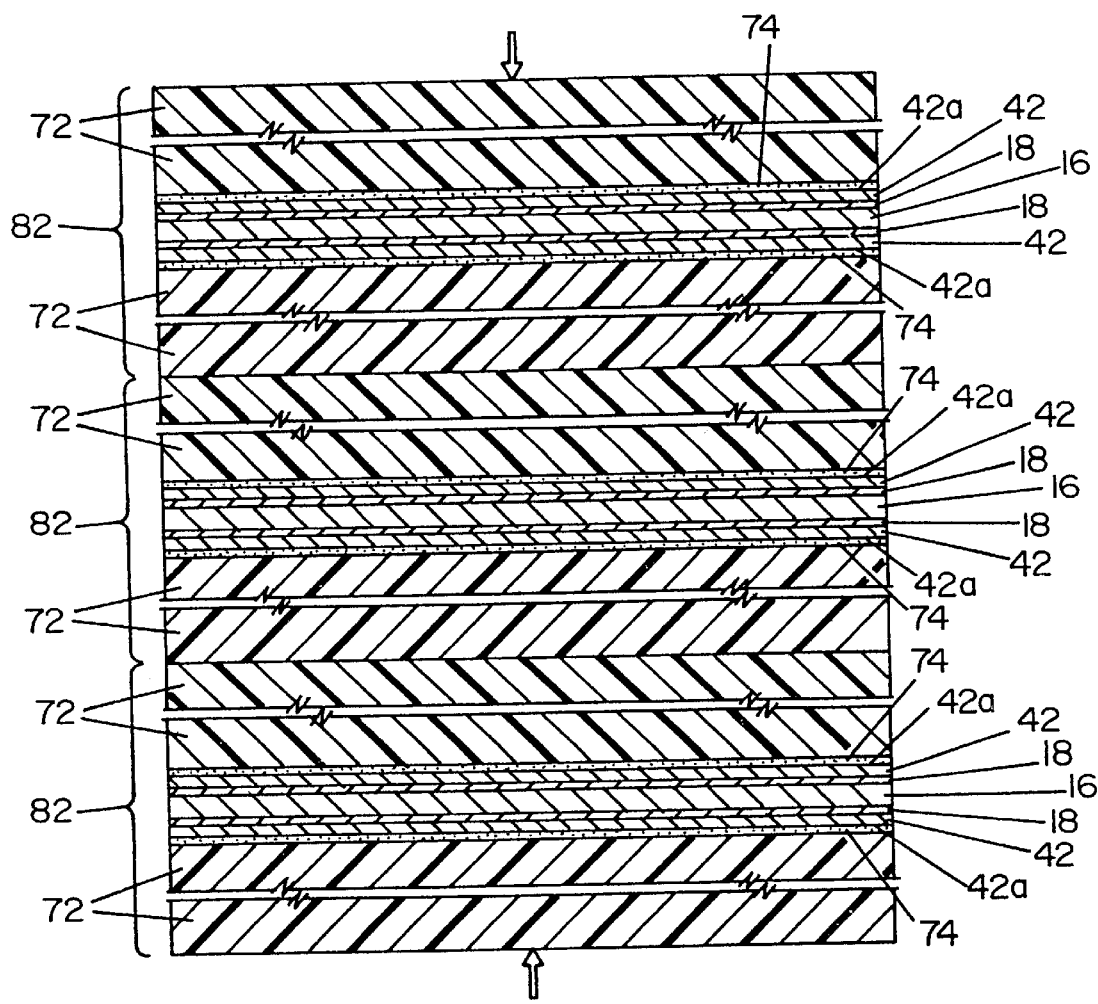
FIG. 5C is a cross-sectional view of a multi-stack pressing.

During a lamination process, each individual sheet S is disposed within a laminating press (not shown) between layers of a prepreg material 72 (best seen in FIGS. 5A–5D) when forming a printed circuit board (or between layers of copper when forming a copper clad laminate). Polymeric release layers 52 are removed from web W thereby exposing copper surfaces 42a of copper layers 42. An adhesive 74 is disposed between surfaces 42a of web W and the prepreg layers 72. Heat and pressure are applied (as schematically illustrated by arrows in FIG. 5B) to stack 82 to adhere copper layers 42 to either the prepreg material 72 (or to a copper material in the case of a copper clad laminate). In accordance with one aspect of the present invention, substrate 16 is dimensioned to have a particular thickness so as to act as a press plate between the respective layers of material. In other words, substrate 16 is made to have sufficient strength to facilitate pressing of the respective components. Since substrate 16 is not as thick as conventional press plates, stacking of a larger number of components is possible within a specific press stack. In this respect, in addition to eliminating the necessity of separate press plates, component 50 facilitates higher productivity in the laminating process by allowing a larger number of stack components to be formed. FIG. 5C shows three stacks 82 pressed together in a lamination process. Each stack 82 is comprised of the same components as heretofore described.

Figure 5D:
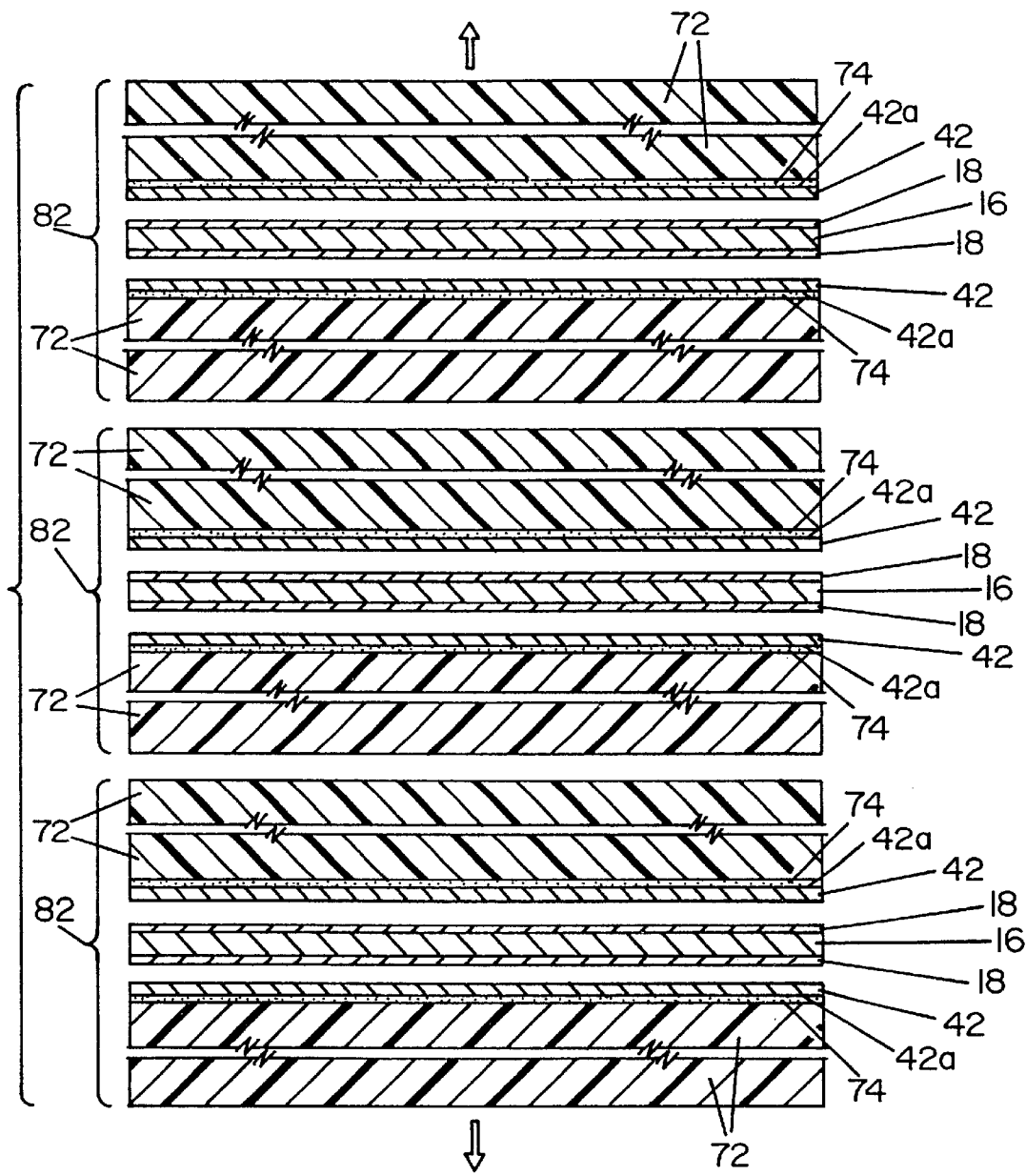
FIG. 5D is a cross-sectional view of the stacks shown in FIG. 5C showing the stacks separated after pressing.

Following the heating and pressing of the lamination process, chromium layers 18 provide separation layers between metal substrate 16 and copper layers 42. Upon opening the press, copper layers 42 that are bonded to prepreg materials 72 will separate from chromium layers 18 leaving clean inner surfaces of copper layers 42 exposed for further processing into printed circuits, as best illustrated in FIG. 5D. Since copper layers 42 are much thinner than conventional copper foil, they allow the etching of very fine, narrow, closely packed, circuit lines which increases the density of components thereon.

In accordance with another aspect of the present invention, carbon steel substrate 16, with chromium layers 18 thereon, is discarded as a disposable element.

The present invention thus provides a quick, relatively inexpensive method of forming ultra-thin layers of copper and utilizing such thin layers of copper in the formation of printed circuit boards or copper clad laminates. Importantly, the carrier substrate, i.e., steel substrate 16, that supports copper layers 48, is utilized as a press plate thereby eliminating the need for separate press components. Further, because of its size, substrate 16 allows greater production in a pressing operation by providing a thinner press plate than structures known heretofore.

The foregoing description is a specific embodiment of the present invention. It should be appreciated that this embodiment is described for purposes of illustration only, and that numerous alterations and modifications may be practiced by those skilled in the art without departing from the spirit and scope of the invention. It is intended that all such modifications and alterations be included insofar as they come within the scope of the invention as claimed or the equivalents thereof.

Having described the invention, the following is claimed:

1. A method of forming a laminate used in the manufacture of printed circuit boards, comprising the steps of:

conveying a generally continuous web of a chromium coated steel substrate along a predetermined path, said chromium having a thickness from about 30 grams per square meter to about 160 grams per square meter and said steel substrate having a thickness from about 0.10 mm to about 0.20 mm;

simultaneously applying a layer of copper having a thickness from about 2 µm to about 70 µm to each of said chromium layers in an electrodeposition cell disposed along said path;

severing said generally continuous web into individual sheets;

positioning one of said sheets between two dielectric layers with adhesive disposed between said copper layers and said dielectric layers;

applying heat and pressure to said layers to bond said copper layers to said dielectric layers;

separating said steel substrate from said copper layers; and discarding said steel substrate.

2. A method of forming a laminate as defined in claim 1, wherein said steel substrate has a thickness from about 0.14 mm to about 0.18 mm.

3. A method of forming a laminate as defined in claim 2, wherein said layer of chromium has a thickness from about 50 grams per square meter to about 140 grams per square meter.

4. A method of forming a laminate as defined in claim 3, wherein said copper layer has a thickness from about 2 µm to about 70 µm.

5. A method of forming a laminate as defined in claim 3, wherein said copper layer has a thickness from about 3 µm to about 35 µm.

6. A method of forming a laminate as defined in claim 3, wherein said copper layer has a thickness from about 5 µm to about 9 µm.

7. A method of forming a laminate as defined in claim 3, wherein said copper layer has a thickness of about 9 µm.

* * * * *